US008978005B2

(12) United States Patent
Iadanza

(10) Patent No.: US 8,978,005 B2
(45) Date of Patent: Mar. 10, 2015

(54) NETWORK RECONFIGURATION IN A DATA CONVERTER FOR IMPROVED ELECTRICAL CHARACTERISTICS

(71) Applicant: International Business Machines Corporation, Armonk, NY (US)

(72) Inventor: Joseph A. Iadanza, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/911,720

(22) Filed: Jun. 6, 2013

(65) Prior Publication Data

US 2014/0365988 A1 Dec. 11, 2014

(51) Int. Cl.
*G06F 17/50* (2006.01)

(52) U.S. Cl.
CPC .................................... *G06F 17/505* (2013.01)
USPC .......................................................... 716/135

(58) Field of Classification Search
CPC ..................................................... G06F 14/505
USPC .......................................................... 716/135
See application file for complete search history.

(56) References Cited

U.S. PATENT DOCUMENTS 4,338,591 A 7/1982 Tuthill
4,491,825 A 1/1985 Tuthill
5,726,652 A 3/1998 Giuroiu
6,222,473 B1 4/2001 Castaneda et al.
6,897,794 B2 5/2005 Kuyel et al.
7,088,274 B2 8/2006 Shill
7,256,721 B2 8/2007 Copley
7,317,413 B2 1/2008 Lee
7,336,211 B1 2/2008 Lai et al.
7,362,253 B2 4/2008 Ko
7,414,561 B1 8/2008 Brubaker
7,468,686 B2 12/2008 Brubaker
7,554,475 B2 6/2009 Ginosar et al.
8,013,772 B2 9/2011 Li
8,564,463 B2 * 10/2013 Agi ............................... 341/118
8,711,022 B2 * 4/2014 Iadanza ......................... 341/154
2011/0037630 A1 2/2011 McLachlan et al.
2011/0231153 A1 * 9/2011 Hamilton et al. ............. 702/180

* cited by examiner

*Primary Examiner* — Jack Chiang
*Assistant Examiner* — Brandon Bowers
(74) *Attorney, Agent, or Firm* — David Cain; Roberts Mlotkowski Safran & Cole, P.C.

(57) ABSTRACT

A process of optimizing a resistor-2 resistor (R-2R) digital-to-analog converter (DAC) by partial resistor network reconfiguration is disclosed. The method includes analyzing a circuit to determine whether any specifications are outside predetermined limits. The method further includes determining one or more addresses that cause the circuit to be outside of the predetermined limits. The method further includes defining logic to detect address information and control function to alter the circuit to improve the specifications. The method further includes installing the control function into the circuit to improve the specifications.

19 Claims, 4 Drawing Sheets

NETWORK RECONFIGURATION IN A DATA CONVERTER FOR IMPROVED ELECTRICAL CHARACTERISTICS

FIELD OF THE INVENTION

The invention relates to semiconductor structures and, more particularly, to a process of optimizing a resistor-2 resistor (R-2R) digital-to-analog converter (DAC) by partial resistor network reconfiguration.

BACKGROUND

In order to implement human-computer interfaces such as display monitors and audio outputs, computer systems employ digital-to analog (DAC) circuits, which convert digital vectors or addresses to an analog voltage or current. Additionally, DAC circuits are used in a host of applications within integrated circuits (ICs) to control, tune, calibrate or test larger more complex systems.

Simulations are used to establish a minimum voltage $V_{min}$ and a maximum voltage $V_{max}$, as defined by equations (1) and (2), respectively, at a DAC output.

$$V_{min}\text{=DAC output with the digital address input minimized} \quad \text{Equation (1)}$$

$$V_{max}\text{=DAC output with the digital address input maximized} \quad \text{Equation (2).}$$

These voltages $V_{max}$, $V_{min}$ are used to calculate an expected DAC output voltage $VOUT_{EXPECT}$, as defined by equations (3)-(5), at each digital address value and an expected change in output voltage value between two digital addresses that differ by one bit.

$$VOUT_{EXPECT}=(\text{LSB*BIN2DEC(Digital Address)})+V\text{min} \quad \text{Equation (3)}$$

$$\text{LSB}=(V_{max}-V_{min})/\text{MAXSTEPS} \quad \text{Equation (4)}$$

$$\text{MAXSTEPS}=(2^N-1)\text{, where } N\text{=a width of a digital address vector} \quad \text{Equation (5).}$$

Once data for these calculations is taken, the digital address is stepped from its minimum value to its maximum value in one bit increments while measuring the output voltage at each step. An ideal DAC output is a stair-step where each plateau or tread represents a voltage equivalent of a digital address input, and a voltage output rises as the digital address input increments from its lowest value to its highest value.

These calculations are also used to determine three measures of DAC circuit quality: (i) integral non-linearity (INL), as defined by equation (6); (ii) differential non-linearity (DNL), as defined by equation (7); and (iii) monotonicity of the circuit. Illustratively, $$\text{INL}=(VOUT_{MEASURED}-VOUT_{EXPECT})/\text{LSB} \quad \text{Equation (6)}$$

$$\text{DNL}=(VOUT_{MEASURED(ADDRESS)}-VOUT_{MEASURED(ADDRESS-1)})/\text{LSB} \quad \text{Equation (7).}$$

INL is a measurement of how closely a voltage measurement at a DAC output matches predicted values at each address step, i.e., when a digital address increases by one bit. DNL is a measurement of how closely the measured voltage step between two consecutive addresses matches the ideal LSB step value computed for the DAC measured at each address step. INL and DNL values between +/−1.0 LSB are desirable. The DAC is monotonic when a direction of a DAC output voltage changes in the same direction as the change of a digital address change, i.e., when the digital address increases, the DAC output voltage increases, and vice-versa.

Example DAC circuits include a ladder DAC and R-2R DAC. A ladder DAC includes a series of resistors, e.g., a resistor ladder, placed between an upper reference voltage supply and ground, or alternatively, a lower reference voltage supply. The resistor ladder sinks current between the voltage supply and ground, and acts as a multiple-tap voltage divider. Selection switches at each resistor connection point selectively connect a ladder node to an output node of the DAC based on the digital address. In implementation, the ladder DAC requires at least $2^N$ resistors and $2^N$ selection elements, where N is the number of bits in the digital address. Although ladder DACs provide good INL, DNL and monotonic performance, physical implementations become large, and an effective impedance between the voltage supply, ground, and a DAC output increases as the number of bits increases, thus limiting transient performance.

The R-2R DAC includes a plurality of resistor stacks separated by a separation resistor. Each bit of the digital address determines whether a source terminal of a resistor stack unique to that digital address bit is driven from either the voltage supply or ground, or alternatively, a lower reference voltage supply. A drain of a resistor stack associated with a most-significant-bit (MSB) is connected to the DAC output. In addition, the R-2R DAC includes a resistor stack disposed between ground and a drain of a resistor stack associated with a least-significant-bit.

An R-2R DAC is efficient in its use of resistors and selection elements. More specifically, the number of resistors required is determined by (3*N)+1 and the number of selection elements is determined by 2*N, where N is the number of digital address bits. Thus, R-2R DACs compare favorably to ladder DACs in terms of silicon area and impedance between the voltage supply, ground, and the DAC output, resulting in faster transient response.

In an R-2R DAC, worst case INL and DNL values occur at a half-address (HA) switch, e.g., for example, in a 7-bit DAC, the half address switch occurs when a digital address switches from 0111111 to 1000000. This is because of an error between an actual resistance value of the resistor stack, e.g., the resistor stack associated with the MSB, due to device mismatch and an ideal value of the resistor stack. As a result, the error swings a voltage of the DAC in opposite directions at the half address switch. Thus, at the half address switch, the DAC output step may be less than the value expected for the LSB and in some cases, may decrease rather than increasing as expected. Thus, the DAC then becomes non-monotonic at the half-address switch.

Although, R-2R DACs with larger resistors provide desirable INL and DNL performance, the area of the resistors far outweighs the area required to implement selection devices, e.g., transistors, for decode logic of an R-2R DAC. Therefore, the large resistor size is a negative in terms of integration/use in larger analog structures. However, R-2R DACs with a smaller resistor area yield undesirable INL or DNL values. Further, similar to the R-2R DAC with larger resistors, the worst case INL and DNL performance occurs at the half address switch. More specifically, at the half address switch, the R-2R DAC may become non-monotonic.

Accordingly, there exists a need in the art to overcome the deficiencies and limitations described hereinabove.

BRIEF SUMMARY

In an aspect of the invention, a method comprises analyzing a circuit to determine whether any specifications are outside predetermined limits. The method further comprises determining one or more addresses that cause the circuit to be outside of the predetermined limits. The method further comprises defining logic to detect address information and control function to alter the circuit to improve the specifications. The method further comprises installing the control function into the circuit to improve the specifications.

In an aspect of the invention, a method comprises determining whether an address exists that has integral non-linearity (INL) or differential non-linearity (DNL) above a target value. The method further comprises determining an address within a circuit where the INL or DNL are above the target value. The method further comprises determining whether there are any partial resistor combinations of the circuit that can be used to create a same voltage. The method further comprises defining logic to detect address and control data and at least one of bypass control and isolation switches. The method further comprises installing the control data and at least one of the bypass control and isolation switches to improve specifications of the circuit.

In an aspect of the invention, a method comprises simulating a digital analog convertor (DAC). The method further comprises determining an address location which causes the DAC to be outside a predetermined specification. The method further comprises altering a component connection within the simulated DAC to provide an improved specification within the predetermined specification.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an R-2R digital-to-analog converter with partial resistor network reconfiguration. In still further embodiments, a method in a computer-aided design system is provided for generating a functional design model of the R-2R digital-to-analog converter with partial resistor network reconfiguration. The method comprises generating a functional representation of the structural elements of the R-2R digital-to-analog converter with partial resistor network reconfiguration.

BRIEF DESCRIPTION OF THE SEVERAL VIEWS OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION

The invention relates to semiconductor structures and, more particularly, to a process of optimizing a resistor-2 resistor (R-2R) digital-to-analog (DAC) converter by partial resistor network reconfiguration. In embodiments, the method of the present invention provides a mechanism to reconfigure specific resistor structures and/or arrangements contributing to analog output at specific points in the digital input space. More specifically, the present invention provides a method of identifying and selecting appropriate addresses and resistor structures based on computer circuit simulation results that model the statistics of a mismatch between all the resistors in the DAC. By using such a modeled simulation, the processes of the present invention are able to reconfigure the R-2R DAC into an optimal configuration, e.g., INL and DNL within certain limits. For example, the present invention presents the example of the mid-point transition (from digital input 0111 . . . 111 to 100 . . . 0000), but accounts for an arbitrary point in the digital input space requiring adjustment.

More specifically, in embodiments, a method is provided for improving the electrical characteristics of a DAC circuit. The method includes, for example, analyzing a simulated circuit to determine if any digital codes exist where one or more analog specifications is above a predetermined value. For each digital code where the specification is to be improved, the method determines if the digital code or analog control for at least one component in the circuit may be altered to provide an improved specification (e.g., voltage). If so, then the altered controlled function is inserted into the simulation of the original circuit (although a physical layout is also contemplated by the present invention). In further embodiments, the method determines, for each digital code where the specification is to be improved, if an alternative component connection exists within the circuit to provide an improved specification. If so, then the method of the present invention will insert the altered connection into the simulated original circuit (or instruct a design/fabricator to insert into the physical original circuit).

Reconfigurable Digital to Analog Converter

Figure 1:
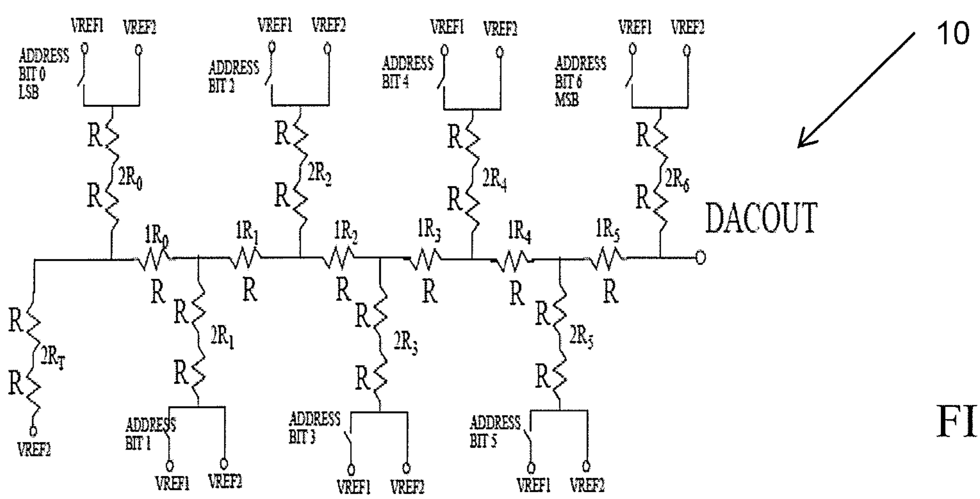
FIG. 1 shows an R-2R digital-to-analog converter (DAC) which can undergo partial resistor network reconfiguration in accordance with aspects of the present invention.

FIG. 1 shows an illustrative R-2R DAC which can undergo partial resistor network reconfiguration in accordance with aspects of the present invention. Although the DAC of FIG. 1 is shown with seven resistor stacks, it should be understood by those of ordinary skill in the art that the DAC may be implemented with any number of resistor stacks depending on a length of the digital address. It should also be understood by those of skill in the art that other circuits can be partially reconfigured using the methods of the present invention, and that the DAC of FIG. 1 should not be considered a limiting feature of the invention.

More specifically, the R-2R DAC 10 of FIG. 1 includes a plurality of resistor stacks $2R_0$-$2R_6$, which each convert a bit of a digital address into an analog signal. In embodiments, the resistor stacks $2R_0$-$2R_6$ include two resistors in series each having a resistance R. The resistor stacks $2R_0$-$2R_6$ are selectively coupled to a respective voltage supply VREF1 and ground VREF2. In embodiments, the resistor stacks $2R_0$-$2R_6$ are separated by resistors $1R_0$-$1R_5$. More specifically, separation resistor $1R_0$ separates a drain of the resistor stack $2R_0$ from a drain of the resistor stack $2R_1$, separation resistor $1R_1$ separates a drain of resistor stack $2R_1$ from a drain of resistor stack $2R_2$, etc.

In embodiments, an output DACOUT is connected to a common node between a drain of resistor stack $2R_6$ and a drain of separation resistor $1R_5$. Additionally, in embodiments, the R-2R DAC 10 includes a termination resistor stack $2R_T$ connected to a common node between the drain of the resistor stack $2R_0$ and a drain of the separation resistor $1R_0$. In embodiments, the termination resistor stack $2R_T$ includes two resistors having a resistance R. The termination resistor stack $2R_T$ is coupled to ground VREF2, or alternatively, a lower reference voltage supply.

In the R-2R DAC 10 of FIG. 1, each bit of the digital address determines the source terminal of a 2R stack of resistors unique to that digital address bit is driven from either VREF1 or VREF2, where R is the size of a unit resistor and the stack is composed of 2 unit resistors. The 2R resistor stack drain for the digital address most-significant-bit (MSB) is tied directly to the DAC output and the drain of the 2R resistors for the MSB-1, MSB-2, MSB-3, etc. bits is separated from the DAC output by an increasing number of the 1R separation resistors, i.e., the MSB-1 2R stack has 1-1R resistor between its drain and the DAC output, the MSB-2 2R stack has 2-1R resistors, a first associated with the MSB-1 separation, and a second to separate the MSB-1 2R stack from the MSB-2 2R stack, etc. In addition, a 2R stack disposed between VREF2 and the drain of the least significant bit (LSB) 2R stack is required for accurate operation.

In operation, the R-2R DAC 10 operates by altering the effective resistor divider network between VREF1 and VREF2 dependent on the digital address input. By way of example, the R-2R DAC 10 of FIG. 1 shows a 7-bit R-2R DAC at its minimum address value, 7'b0000000. With a digital address=7'b0000000, all seven 2R stacks associated with the digital address inputs are sourced from VREF2 and the DACOUT is forced to VREF2. However, when the LSB of the digital address is switched from 0 to 1 (7'b0000001), stack $2R_0$, for example, is sourced from VREF1 while all other 2R stacks (i.e., $2R_1$, $2R_2$, $2R_3$, $2R_4$, $2R_5$ and $2R_6$) are sourced from VREF2. Because $2R_0$ is separated from DACOUT by resistors $1R_0$, $1R_1$, $1R_2$, $1R_3$, $1R_4$ and $1R_5$ and is therefore less influential on DACOUT than $2R_1$, $2R_2$, $2R_3$, $2R_4$, $2R_5$ and $2R_6$, the resulting voltage change at DACOUT is 1 LSB.

If the LSB+1 digital address is changed to a 1, for example, the 2R1 stack is now sourced by VREF1, such that the DAC address equals 7'b0000011. As the bit switched moves from the LSB position toward the MSB position (i.e., advancing the digital address from 7'b0000011 successively through 7'b0000111, 7'b0001111, 7'b0011111, 7'b0111111 and 7'b1111111) the effect of the bit is to move the output voltage by $2^X$ steps, where X is the position of the bit within the digital address vector <n:0>. Thus, the LSB+1 bit would move the output 2 LSBs, the LSB+2 bit would move the output 4 LSBs, etc.

Although the R-2R DAC 10 is very efficient in its use of resistors and selection elements, further investigation of the INL and DNL performances, though, reveals that peak INL and DNL values are reached when the R-2R DAC transitions from 7'b0111111 to 7'b1000000, i.e., worst case INL and DNL values occur at a half-address (HA) switch, e.g., for example, in a 7-bit DAC, the half address (HA) switch occurs when a digital address switches from 0111111 to 1000000. This is because of an error between an actual resistance value of the resistor stack, e.g., the resistor stack associated with the MSB, due to device mismatch and an ideal value of the resistor stack. As a result, the error swings a voltage of the DAC in opposite directions at the half address switch. Thus, at the half address switch, the DAC output step may be less than the value expected for the LSB and in some cases, the output voltage may decrease rather than increasing as expected. Thus, the DAC then becomes non-monotonic at the half-address switch. This behavior is inherent in the R-2R architecture. At the 7'b0111111 address code, for example, the MSB stack $2R_6$ is the only stack with the exception of the LSB termination stack $2R_T$ that is sourced from VREF2; however, all other 2R stacks are sourced from VREF1.

More specifically, when the address code increments by 1 LSB to 7'b1000000, sourcing of all 2R stacks, other than $2R_T$, reverses. At this code, 2R stacks $2R_0$, $2R_1$, $2R_2$, $2R_3$, $2R_4$ and $2R_5$ are sourced by VREF2 while stack $2R_6$ is the only stack sourced from VREF1. Because error between the actual resistance value of $2R_6$ due to device mismatch and the ideal value of 2*Unit Resistance will swing the voltage error in opposite directions between these two codes and because MSB stack $2R_6$ is connected directly to the DACOUT node, the worst case INL and DNL of an R-2R DAC is realized at the half-address switch from code $(0.5*2^N)-1$ to $(0.5*2^N)$, where N is the number address bits.

To estimate the degradation of an R-2R DAC performance either due to reductions in resistor area, or worsening of resistor tolerance, a montecarlo simulation was conducted with a resistor size of R=9.6643 Kohms, W=0.430 um, L=11.5 um, Area=4.95 um$^2$, which yields a physical R-2R DAC implementation which is 17.2% of the original area. The result was an INL of +/−0.676 LSB and a DNL of +/−1.35 LSB. Again, it was found that the worst case INL and DNL performance occurs at the half address switch, with the DAC becoming non-monotonic at half-address (HA). However, in order to support higher levels on integration of analog and mixed signal devices in evolving technologies that inherently have degraded tolerance for passive elements such as resistors, a space efficient digital-to-analog converter (DAC) with acceptable INL, DNL and monotonic performance is required.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a “circuit,” “module” or “system.” Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). These computer program instructions may also be stored in a computer readable storage medium that can direct a computer, other programmable data processing apparatus, or other devices to function in a particular manner, such that the instructions stored in the computer readable medium produce an article of manufacture including instructions which implement the function/act specified in a flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 2:
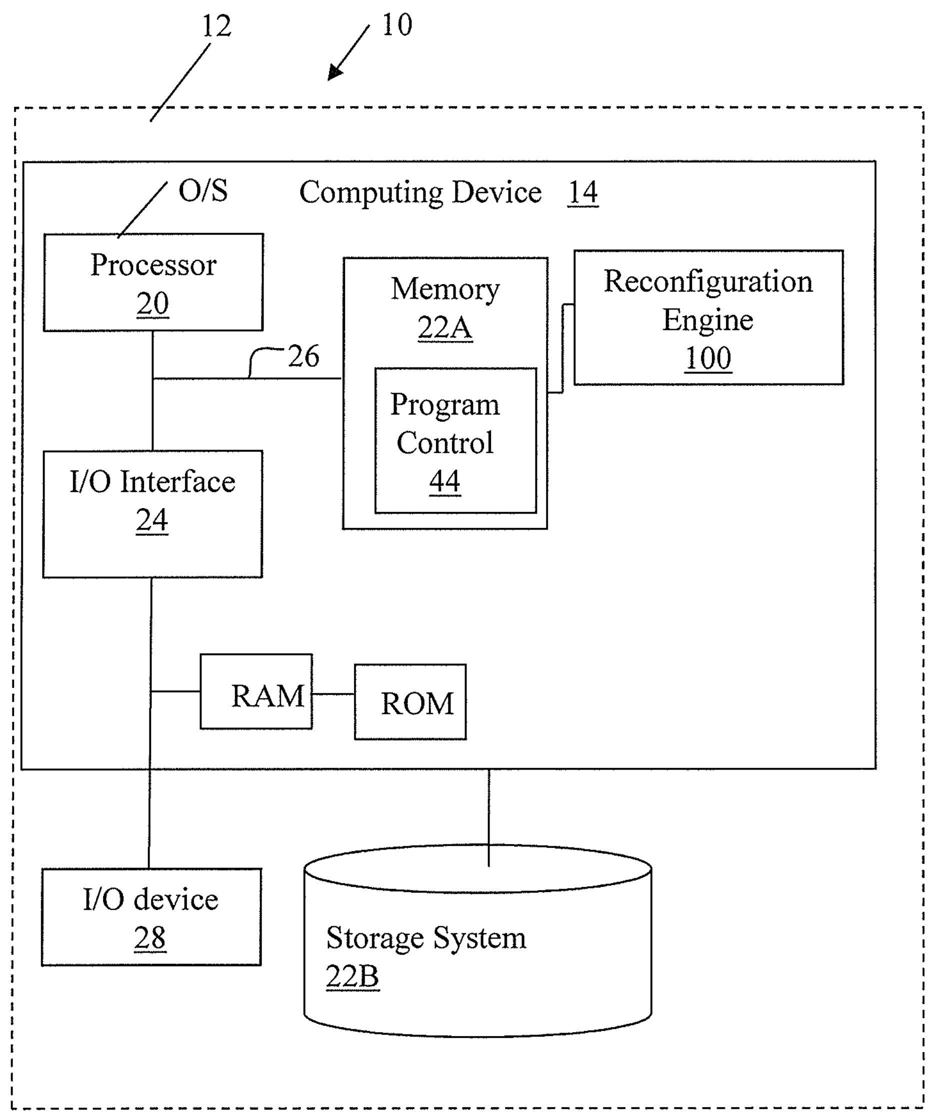
FIG. 2 is an illustrative external environment for implementing the invention in accordance with aspects of the invention.

FIG. 2 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 2). The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

The computing device 14 includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S). The bus 26 provides a communications link between each of the components in the computing device 14.

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc.

In general, the processor 20 executes computer program code (e.g., program control 44), which can be stored in the memory 22A and/or storage system 22B. Moreover, in accordance with aspects of the invention, the program control 44 controls a reconfiguration engine 100 that performs one or more of the processes described herein. While executing the computer program code, the processor 20 can read and/or write data to/from memory 22A, storage system 22B, and/or I/O interface 24. The reconfiguration engine 100 can be implemented as one or more program code in the program control 44 stored in memory 22A as separate or combined modules. Additionally, the reconfiguration engine 100 may be implemented as separate dedicated processors or a single or several processors to provide the function of these tools.

In embodiments, the reconfiguration engine 100 can identify whether any digital address code of a circuit, e.g., the R-2R DAC 10 of FIG. 1, has electrical specifications (analog specifications) which require improvement given a starting design point, and particularly at a half address. For example, an identification is made as to whether a DAC address exists which is above certain threshold limits, e.g., above a threshold value. Illustratively, a threshold value can be a limit outside of: INL of +/−1.0 LSB or a DNL of +/−1.0 LSB. If so, a digital address code can be determined, which is likely a half address code. By way of example, a half address code can be can be identified by:

Half_Address=HA=MSB && !MSB-1 && !MSB-2 && . . . && LSB

For the 7 bit example of FIG. 1, the half address can be identified as:

$HA=B_6$ && $!B_5$ && $!B_3$ && $!B_3$ && $!B_2$ && $!B_1$ && $!B_0$

If a found digital address code does not meet certain threshold limits, e.g., above a threshold value, a set of codes for improvement is generated and a search is made for any reconfigurations using all or part of the structure that could create the voltage in an advantageous manner. Specifically, if there is a possible reconfiguration that can create a desirable voltage, logic is defined to detect the address code for control data, and/or bypass certain resistors within the resistor stacks and/or isolation of certain resistors in the resistor stack to implement the reconfiguration. In other words, the present invention provides a control function that is used to alter the original circuit (e.g., R-2R DAC) to improve its performance specification, e.g., INL and DNL within desired limits. That is, the control function can be data control, or resistor bypass and/or isolation control logic which is inserted into the circuit (simulation of the circuit) in order to alter its functionality/logic to perform within defined specifications.

By way of illustrative example, Tables 1 and 2 can be representative of reconfiguration/logic that is implemented in accordance with aspects of the present invention. Specifically, Table 1 shows logic for a LSB stack $2R_0$ source of the R-2R DAC 10 of FIG. 1.

TABLE 1

| HA | LSB (Bit0) | Stack $2R_0$ Source Voltage | Comment |
|---|---|---|---|
| 0 | 0 | VREF2 | All Addresses where LSB = 0; except for Half Address |
| 0 | 1 | VREF1 | All Addresses where LSB = 1; except for Half Address |
| 1 | 0 | VREF1 | Half Address, Source Forced to VREF1 |
| 1 | 1 | VREF1 | Half Address, Source Forced to VREF1. |

As shown in Table 1, and by way of illustrative example, with the processes of the present invention, given the above logic for a R-2R DAC 10 of FIG. 1, whenever Half_Address (HA) is detected and asserted (HA=1), the selection device for the LSB (Bit 0) will drive the source of resistor stack $2R_0$ to VREF1. However, whenever HA is not detected/asserted, the LSB will act in accordance with the value of the LSB for the digital address input, as in the R-2R DAC 10 of FIG. 1, e.g., HA=0.

Table 2, on the other hand, represents a situation when there is an LSB stack source for stacks $2R_1$, $2R_2$, $2R_3$, $2R_4$, $2R_5$ and $2R_6$ of the R-2R DAC 10 of FIG. 1.

TABLE 2

| HA | Bit 1-6 | Source of Stack Resistors $2R_{1-6}$ | Comment |
|---|---|---|---|
| 0 | 0 | VREF2 | The source of Each stack resistor is driven in accordance with its associated digital address input bit. If the digital bit = Logic0, the source is connected to VREF2 |
| 0 | 1 | VREF1 | The source of Each stack resistor is driven in accordance with its associated digital address input bit. If the digital bit = Logic1, the source is connected to VREF1 |
| 1 | 0 | High Impedance | When HA = 1, the selection device tristates such that the source of the stack resistor is high impedance. No current flows and no voltage division occur due to this connection. Note that HA = 1 and $Bit_X = 0$ may be mutually exclusive given the logic definition for HA. |
| 1 | 1 | High Impedance | When HA = 1, the selection device tristates such that the source of the stack resistor is high impedance. No current flows and no voltage division occur due to this connection. Note that HA = 1 and $Bit_X = 1$ may be mutually exclusive given the logic definition for HA. |

Given the above logic, in implementations of the present invention, whenever Half_Address (HA) is detected and asserted (HA=1), the selection devices for all bits other than the LSB can be directed to go into high impedance. In this reconfiguration, stack resistors $2R_1$, $2R_2$, $2R_3$, $2R_4$, $2R_5$ and $2R_6$ do not contribute to the voltage division to form the output, DACOUT. However, it should be noted that when HA is not detected/asserted (HA=0), bits above the LSB contribute to control of the voltage division of the DAC, as R-2R DAC 10 of FIG. 1. Thus, when HA=0, the revised (reconfigured) architecture looks and operates like the R-2R DAC 10 of FIG. 1; however, when HA=1, stack resistors $2R_1$, $2R_2$, $2R_3$, $2R_4$, $2R_5$ and $2R_6$ are reconfigured in accordance with the above logic so as to not contribute to the DAC output, which is now formed as a voltage divider between VREF1 and VREF2 comprised of $2R_0$ and $2R_T$.

Because $2R_0$ and $2R_T$ are equally sized and because the statistical affects of $2R_0$ have previously been seen in LSB address switches, the overall mismatch or INL evident at the HA point should be reduced by the reconfiguration of the R-2R stack of FIG. 1 as shown in the Table 2. Also, it should be recognized that while first resistors $1R_0$, $1R_1$, $1R_2$, $1R_3$, $1R_4$ and $1R_5$ remain in the network, they do not contribute to mismatch as no current (other than in the voltage transient) flows through these devices. While the voltage transition is slowed by $1R_0$, $1R_1$, $1R_2$, $1R_3$, $1R_4$ and $1R_5$, only $2R_0$ and $2R_T$ affect the output voltage value.

Thus, in implementations of the present invention, if data control is required, data control logic is installed, and if bypass or isolation control is required, it is installed as shown in the above tables. The processes work through the entire list of address codes for improvement until all codes have been processed and either found to be non-correctable via the processes or alternate configurations have been installed as shown above.

It should be understood that while the present invention is described with respect to a half address (HA), the systems and processes of the present invention provide a general methodology for analyzing a R-2R structure, identifying alternate resistor combinations which employ a subset of resistors in an alternate configuration, or a full set of resistors in an alternate configuration, defining a connection/architecture which embodies the alternate combination(s) and implementing the additional devices in a manner which leads to improved performance.

Flow Diagram Implementing Processes of the Invention

Figure 3:
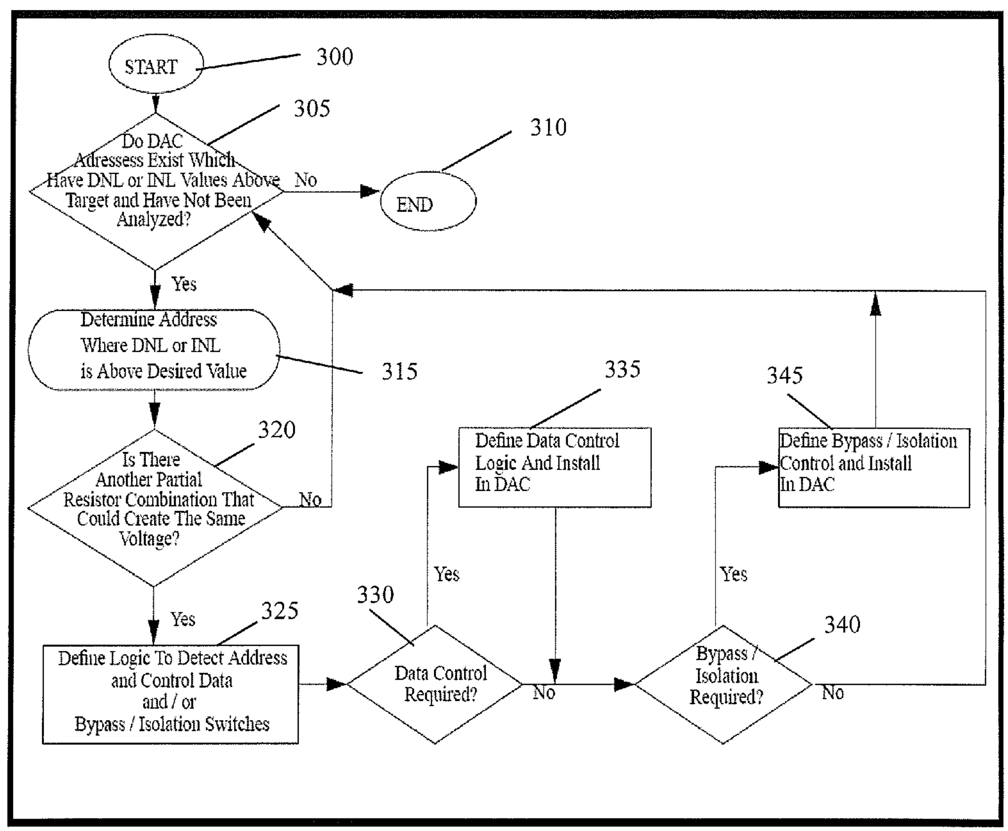
FIG. 3 shows a flow diagram implementing aspects of the present invention.

FIG. 3 shows an exemplary flow for performing aspects of the present invention. The steps of FIG. 3 may be implemented in the environment of FIG. 2, for example. The flow can be representative of processes, apparatus (systems) and computer program products according to embodiments of the invention. It will be understood that each block of the flowchart illustrations can be implemented by computer program instructions, which are implemented by the environment of FIG. 2, e.g., implemented using the reconfiguration engine 100. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

More specifically, FIG. 3 depicts an exemplary flow for a process in accordance with aspects of the present invention. FIG. 3 may be implemented as a simulation for partially reconfiguring an R-2R DAC, using known simulation hardware, e.g., SPICE (Simulation Program with Integrated Circuit Emphasis), SPECTRE, etc. As should be understood by those of skill in the art, SPICE is a computer simulation and modeling program to mathematically predict the behavior of electronic circuits. A circuit is presented to SPICE in the form of a netlist, as discussed below. SPICE supports the Verilog-A modeling language. SPECTRE is a SPICE class circuit simulator.

More specifically, FIG. 3 shows a general flow for conversion of an R-2R DAC to a partial resistor configuration R-2R DAC in order to ensure optimal performance, e.g., INL and DNL values are below a target value. It should be understood by those of skill in the art that while the flow provides a process for reconfiguration of an R-2R DAC for a Half_Address (HA) point, the processes may equally represent a general methodology for analyzing DAC structures.

At step 300, the process starts. At step 305, a determination is made as to whether a DAC address exists which has a DNL or INL above a target, and which has not yet been analyzed. In embodiments, the target value is outside the limits +/−1.00 LSB. If none exists, then the process ends at step 310. If a DAC address exists which has a DNL or INL above the target and which has not yet been analyzed, the process continues to step 315. At step 315, the process of the present invention determines the address where the DNL or INL is above a desired value (e.g., above the target). For example, the process of the present invention can find the half address (HA): Half_Address=HA=MSB && !MSB-1 && !MSB-2 && . . . && LSB.

At step 320, a determination is made as to whether there is another partial resistor combination of an R-2R circuit that could create a same voltage as the analyzed, simulated R-2R circuit. For example, the processes of the present invention can run simulations to determine whether any configuration of the simulated circuit results in the same voltage as the original circuit under simulation. If none exists, then the process reverts back to step 310.

If there is another partial resistor combination available, then at step 325, the process of the present invention defines the logic to detect address and control data and/or bypass/isolation structures. By way of example, this can be performed with the logic shown in Tables 1 and 2. Once the logic is defined at step 325, the process proceeds to step 330. At step 330, a determination is made as to whether data control is required. If no data control is required, then the process proceeds to step 340; however, if there is available data control, the process continues to step 335. At step 335, the data control logic is installed (inserted) in the simulated circuit. This installation can be provided in the simulation. The processes continue to step 340.

At step 340, a determination is made as to whether any bypass/isolation of the resistors in a circuit is required. If so, then the process continues to step 345, where the bypass/isolation switch can be installed (inserted) in the simulated circuit. The process then reverts back to step 310. In embodiments, the processes of the present invention work through the entire list of address codes for improvement until all codes have been processed and either found to be non-correctable via the processes of the present invention or alternate configurations have been installed. The final architecture can be re-simulated to ensure proper functionality.

Figure 4:
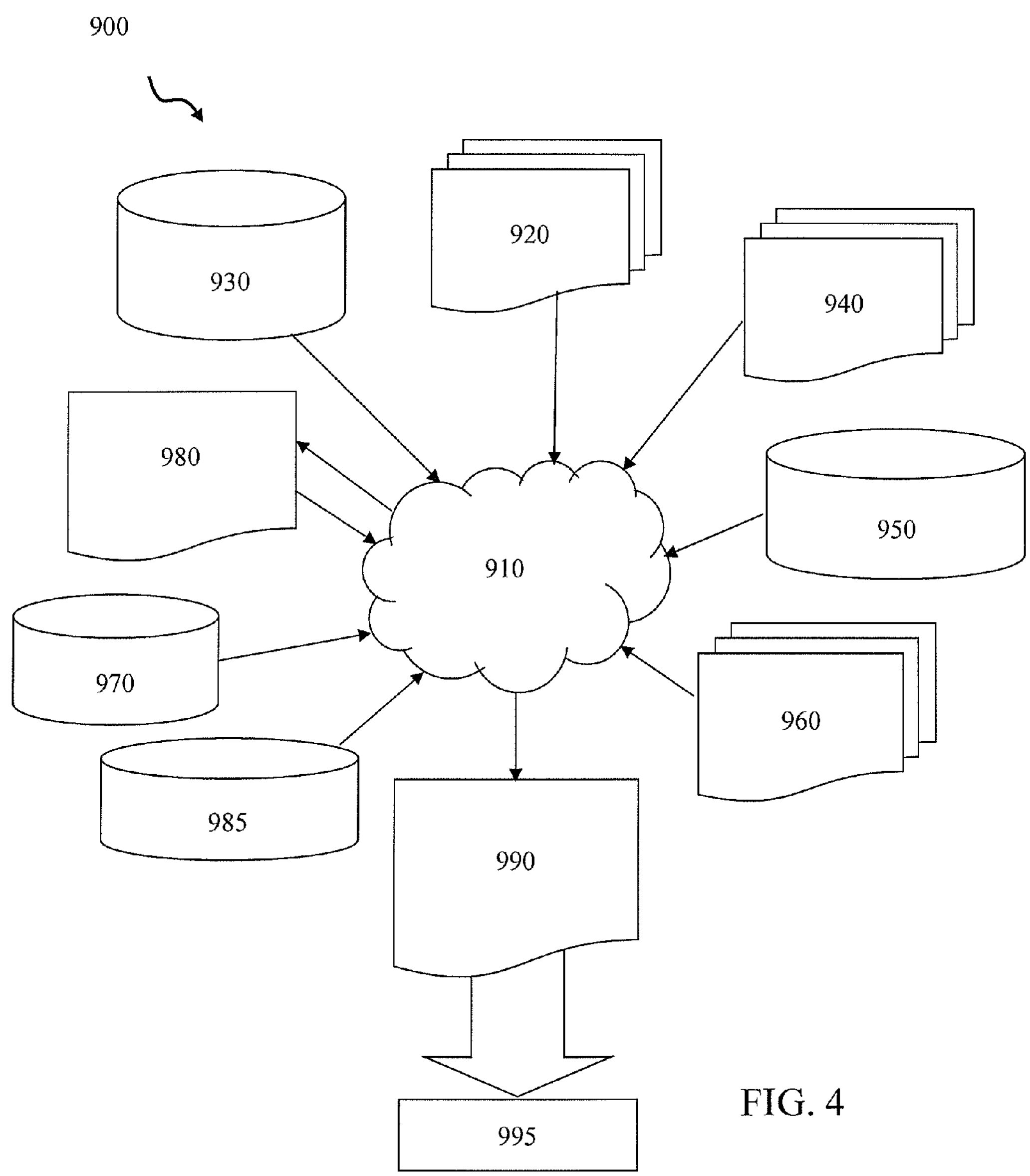
FIG. 4 is a flow diagram of a design process used in semiconductor design, manufacture, and/or test.

FIG. 4 illustrates multiple design structures including an input design structure 920 that is preferably processed by a design process 910, which can be representative of the simulation processes of the present invention. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention. In one embodiment, design structure 990 may comprise a compiled, executable HDL simulation model that functionally simulates the devices.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method implemented in computing infrastructure, comprising analyzing a circuit to determine whether any specifications are outside predetermined limits and whether one or more addresses exist that have yet to be analyzed;

determining whether at least one of the one or more addresses cause the circuit to be outside of the predetermined limits;

defining logic to detect address information and a control function to alter the circuit to improve the specifications; and installing, by the computing infrastructure, the control function into the circuit to improve the specifications wherein the specifications comprise integral non-linearity (INL) and differential non-linearity (DNL).

2. The method of claim 1, wherein the predetermined limits are INL and DNL values between +/−1.0 least significant bit (LSB).

3. The method of claim 1, further comprising determining whether a partial resistor reconfiguration would create a same voltage of the circuit and inserting the partial resistor reconfiguration into a simulation of the circuit.

4. The method of claim 3, wherein the defining of the control function comprises defining control data which is inserted into the circuit to alter the circuit.

5. The method of claim 3, wherein the defining of the control function comprises defining resistor bypass control which is installed into the circuit to alter the circuit.

6. The method of claim 3, wherein the defining of the control function comprises defining resistor isolation control which is installed into the circuit to alter the circuit.

7. The method of claim 1, wherein the determining of the one or more addresses is a determination of a half address.

8. The method of claim 1, wherein when the specifications are outside of the predetermined limits, a search is made for any reconfigurations using all or part of the circuit that could create a desired voltage.

9. The method of claim 1, wherein the analyzing of the circuit comprises analyzing a simulation of the circuit.

10. The method of claim 9, wherein the analyzing the circuit includes determining an address which has DNL or INL values outside of the predetermined limits.

11. The method of claim 1, wherein the control function comprises an alternative component connection within the circuit to provide an improved specification.

12. A method implemented in a computing infrastructure, comprising determining whether one or more addresses exists that have yet to be analyzed and that have integral non-linearity (INL) or differential non-linearity (DNL) above a target value;

determining an address of the one or more addresses within a circuit where the INL or DNL are above the target value;

determining whether there are any partial resistor combinations of the circuit that can be used to create a same voltage;

defining logic to detect address and control data and at least one of bypass control and isolation switches; and installing, by the computing infrastructure, the control data and at least one of the bypass control and isolation switches to improve specifications of the circuit.

13. The method of claim 12, wherein the target values are INL and DNL values above +/−1.0 least significant bit (LSB).

14. The method of claim 12, wherein the circuit is a simulation of the circuit.

15. The method of claim 12, wherein the installing the control data and at least one of bypass control and isolation switches comprises an alternative component connection within the circuit to provide an improved specification.

16. The method of claim 12, wherein the improved specification is voltage.

17. A method implemented in computing infrastructure, comprising:

simulating a digital analog convertor (DAC);

determining whether one or more address locations exists that have yet to be analyzed and that have integral non-linearity (INL) or differential non-linearity (DNL) above a predetermined specification;

determining an address location of the one or more address locations which causes the DAC to be outside the predetermined specification; and altering, by the computing infrastructure, a component connection within the simulated DAC to provide an improved specification within the predetermined specification.

18. The method of claim 17, wherein the predetermined specification are target values of INL and DNL values within +/−1.0 least significant bit (LSB).

19. The method of claim 17, wherein the altering the component connection comprises at least one of: defining and installing data control logic into the DAC and defining and installing bypass/isolation control into the DAC.

* * * * *